(12) United States Patent
Beddingfield et al.

(10) Patent No.: US 11,063,579 B2
(45) Date of Patent: Jul. 13, 2021

(54) CIRCUIT FOR PROVIDING VARIABLE WAVEFORM EXCITATION

(71) Applicant: NORTH CAROLINA STATE UNIVERSITY, Raleigh, NC (US)

(72) Inventors: Richard B. Beddingfield, Raleigh, NC (US); Subhashish Bhattacharya, Raleigh, NC (US); David Storelli, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 16/761,536

(22) PCT Filed: Nov. 8, 2018

(86) PCT No.: PCT/US2018/059817
§ 371 (c)(1),
(2) Date: May 5, 2020

(87) PCT Pub. No.: WO2019/094586
PCT Pub. Date: May 16, 2019

(65) Prior Publication Data
US 2020/0382010 A1 Dec. 3, 2020

Related U.S. Application Data

(60) Provisional application No. 62/583,843, filed on Nov. 9, 2017.

(51) Int. Cl.
*H02M 7/501* (2007.01)
*H03K 4/94* (2006.01)
(Continued)

(52) U.S. Cl.
CPC .......... *H03K 4/94* (2013.01); *G01R 33/0023* (2013.01); *H02J 1/082* (2020.01); *H02M 3/33576* (2013.01); *H02M 7/501* (2013.01)

(58) Field of Classification Search
CPC .......................... G01R 33/0023; H02J 1/082; H02M 3/33576; H02M 7/501; H03K 4/94
(Continued)

(56) References Cited

U.S. PATENT DOCUMENTS 5,552,683 A * 9/1996 Dargent ................ H02P 7/0094
318/256
5,946,200 A * 8/1999 Kim ........................ H02M 1/34
363/17

(Continued)

OTHER PUBLICATIONS

PCT/US2018/059817, "International Search Report and Written Opinion", dated Jan. 17, 2019, 8 pages.

*Primary Examiner* — William Hernandez
(74) *Attorney, Agent, or Firm* — Kilpatrick Townsend & Stockton LLP

(57) ABSTRACT

A circuit for testing an electronic component, such as a transformer, includes at least two power supplies and at least two H bridge circuits. A first H bridge circuit is conductively coupled in parallel to a first power supply. A second H bridge circuit is conductively coupled in parallel to a second power supply. The second H bridge circuit includes one or more anti-series diodes for preventing current from the first power supply from passing through the second H bridge circuit to the second power supply. The first H bridge circuit and the second H bridge circuit are configured to conductively couple to the electronic component for providing a voltage with a predefined waveform to the electronic component.

20 Claims, 12 Drawing Sheets

(51) Int. Cl.
*H02M 3/335* (2006.01)
*H02J 1/08* (2006.01)
*G01R 33/00* (2006.01)

(58) Field of Classification Search
USPC .......................................................... 327/130
See application file for complete search history.

(56) References Cited

U.S. PATENT DOCUMENTS

| | | |
|---|---|---|
| 2008/0284209 A1 | 11/2008 | Fukazawa |
| 2008/0316778 A1 | 12/2008 | Wagoner |
| 2010/0073039 A1 | 3/2010 | Kanai et al. |
| 2010/0254221 A1 | 10/2010 | Smith |
| 2015/0131347 A1 | 5/2015 | Kulka |

\* cited by examiner

TABLE I. SWITCH TIMING AND STRESSES

| Switch | On Time | On Delay | Voltage | Current |
|---|---|---|---|---|
| $S_1, S_4$ | $\Delta T$ | 0 | $\frac{1}{2} V_{High}$ | $I_{L}$ Range 1 |
| $S_2, S_3$ | $\Delta T$ | 180° | $\frac{1}{2} V_{High}$ | $I_{L}$ Range 1 |
| $S_1', S_4'$ | $\frac{1}{2} T_{pd} - \Delta T$ | $\Delta T$ | $\frac{1}{2} V_{Low}$ | $I_{L}$ Range 1 |
| $S_2', S_3'$ | $\frac{1}{2} T_{pd} - \Delta T$ | $\Delta T + 180°$ | $\frac{1}{2} V_{Low}$ | $I_{L}$ Range 2 |
| $D_{Reverse}$ | $\frac{1}{2} T_{pd} - \Delta T$ | $S'$ Time | $\frac{1}{2}(V_{High} - V_{Low})$ | $I_{L}$ Range 2 |
| $D_{Body}$ | $T_{Deadband}$ | $\frac{1}{2} T_{pd}$ | $\frac{1}{2} V_{High}$ | $I_{L}$ Range 2 |
| $D_{Body}'$ | 0 | Never | $\frac{1}{2} V_{Low}$ | 0 |

CIRCUIT FOR PROVIDING VARIABLE WAVEFORM EXCITATION

CROSS-REFERENCE TO RELATED APPLICATION

This claims priority to U.S. Provisional Application Ser. No. 62/583,843, titled "Circuit for Providing Variable Waveform Excitation" and filed Nov. 9, 2017, the entirety of which is incorporated herein by reference.

GOVERNMENT FUNDING

This invention was made with government support under grant number DE-EE0007508 awarded by the Department of Energy. The government has certain rights in this invention.

TECHNICAL FIELD

The present disclosure relates generally to excitation circuits. More specifically, but not by way of limitation, this disclosure relates to a circuit for providing variable waveform excitation.

BACKGROUND

A dual active bridge ("DAB") is a circuit topology that subjects magnetic materials to trapezoidal excitation. This circuit topology can combine an energy storage component with isolation in a high frequency (HF) transformer. A technique used to improve the performance of a DAB is to adjust the converter switching pattern, which can increase the HF transformer applied voltage from two to three levels. This can exaggerate the trapezoidal nature of the exciting waveform produced by the DAB. An inductor can be included in series with the HF transformer to allow for a finely tuned inductive storage element without being beholden to the HF transformer leakage inductance. This can improve the control stability and can enable an increased operating range. In another example, an auxiliary transformer can be included as a controllable inductance in series with the HF transformer. In both of these cases, the exciting flux of the magnetic elements can be trapezoidal.

A contributing factor to the prevalence of trapezoidal excitation in the magnetic material can be when the HF transformer has a leakage inductance mismatch. This can occur when there is a large turns-ratio and the normalized inductance is unevenly distributed. One example of this situation is in electric vehicles where battery voltages can be stepped up to drive voltages. The three port DAB can use multiply sloped trapezoidal excitation over some operating conditions. Other topologies can subject magnetic components to trapezoidal excitation as well, including the flyback converter and brushless DC motors. It can be valuable, however, that materials be well defined and understood.

Equation (1) below can be used to curve fit sinusoidal core loss profiles for a material. The coefficients k, α, and β are loss parameters while the sinusoidal wave is characterized by frequency, f, and peak induction level, B. This equation can be expanded and used for more sophisticated relationships and to expand this curve fit to other wave shapes and generalize the equation. But, DC excitation and trapezoidal excitation can be problematic and can include more parameters.

$$P\_v = k f^\alpha B^\beta \tag{1}$$

Further difficulty can arise in generating the trapezoidal excitation for experimental validation of the aforementioned curve fitting-based predictions. An auxiliary winding is coupled to the magnetic core being tested to enable the injection from another converter. A system analysis of the DAB losses can be made possible by connecting the two converters to the same DC bus and transferring loss power through the HF transformer. But, this approach may not provide a clear characterization of the magnetic materials. Furthermore, a full design can be helpful for meaningful study and thus results can be limited in scalability and generalization.

A circuit that can generate square and bipolar voltages can be used to study the core characteristics and performance of a magnetic core. But, this approach can apply a small negative voltage through the voltage drop of a MOSFET on resistance. This can force a negative current slope that can obfuscate the true core performance.

BRIEF DESCRIPTION OF THE DRAWINGS

FIG. 4 depicts a table with a description of the switch gating times as well as the voltage and current stress seen by each device according to one example of the present disclosure.

DETAILED DESCRIPTION

Figure 1:
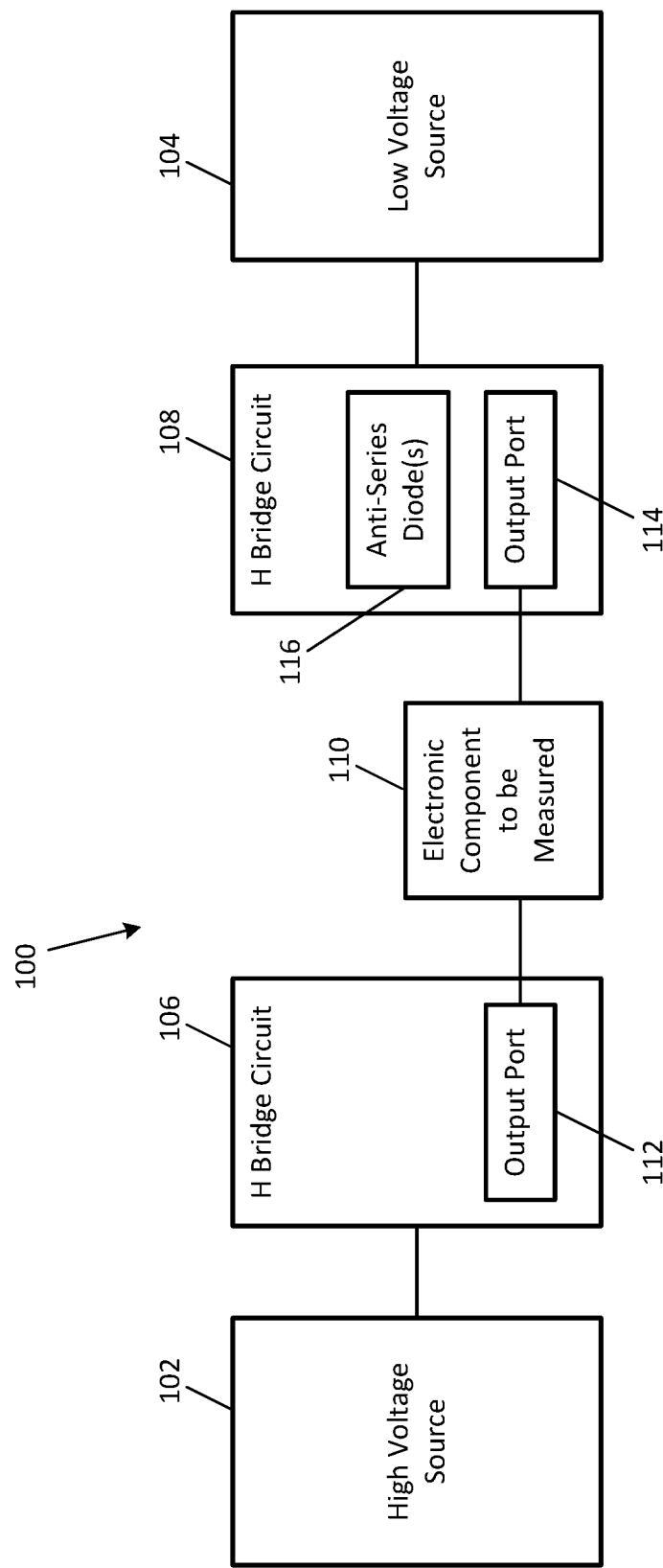
FIG. 1 is a block diagram of an electronic component measurement system according to one example of the present disclosure.

Certain aspects and features of the present disclosure relate to a circuit for providing variable waveform excitation that can be used to improve the speed and efficiency of electrical components manufactured in a process that uses the circuit, for example in a test or validation step in the process. In some aspects, the circuit can be part of a test bench for determining characteristics of an electrical component. For example, the circuit can apply a predetermined voltage waveform to the electrical component and measure a response of the electrical component. The response of the electrical component can be used to determine a set of characteristics (e.g., material characteristics) of the electrical component. Knowing the set of characteristics of different electrical components can allow for devices to be developed and manufactured using more precise electrical component configurations, which can improve the speed and efficiency of the devices.

A circuit according to some examples can also determine the response of the electrical component to various waveforms that the electrical component is predicted to experience during operation as part of an electrical device. The simulation can be used to determine if the electrical component will respond as desired in response to potential waveforms. The circuit can also allow for unique study of magnetization physics at the macro level that was previously impossible to explore. Studying the magnetization physics can allow for devices to be designed that use magnetization physics. Although the circuit is described herein as a test apparatus, in other aspects the circuit can be used to connect multiple DC power sources of different voltage levels to the same port of a high frequency transformer. The multiple parallel connections can be controlled to behave as a multiport dual active bridge.

A circuit according to some examples can include two or more voltage sources that are conductively coupled to H bridge circuits. Each of the H bridges can include anti-series diodes (or blocking diodes), except for the H bridge coupled to the voltage source with the highest level of voltage. The anti-series diodes can prevent signals from the highest voltage source from flowing through the low voltage source. The anti-series diodes can also direct the signals from the voltage sources through an electronic component conductively coupled to output ports of the circuit. The circuit can be conductively coupled to the electronic component to excite the electronic component with a waveform defined by the number, voltage level, and arrangement of voltage sources included in the circuit.

As an example, a first voltage source can be conductively coupled to a first H bridge circuit, which can be conductively coupled in parallel with a second H bridge circuit that is coupled to a second voltage source. The second voltage source can be a lower level voltage source than the first voltage source and the second H bridge circuit can include anti-series diodes to prevent the higher voltage excitation output by the first H bridge circuit from passing through the second H bridge circuit. The combination of the two voltage sources can enable the application of multiple voltage levels, enabling the testing of an electronic component (e.g., a magnetic core or a capacitor) with a high power excitation waveform of any shape. In some examples, the predefined waveform is a flat top trapezoidal waveform or a high frequency sinusoid waveform In some examples, the circuit can provide high-power, square-wave excitation at high frequencies. In additional or alternative examples, the circuit can provide multiple levels of voltage to generate an arbitrary excitation waveform. The circuit can enable the use of open secondary testing to minimize sensor and circuit impacts on the results. In some aspects, the circuit can provide a constant average DC bias voltage through the second H bridge circuit, which can be used for DC current biasing magnetic components or DC bias other test devices with various voltage-to-current relationships.

The circuit can be used as a magnetic core testbed. A magnetic core testbed can be intended to provide a variety of induction curves to fully characterize a magnetic material. Some magnetic testbeds are prohibitively expensive and limited in testing range for research purposes. For example, some magnetic testbeds are unable to provide the high voltages or currents to create a variety of induction profiles beyond sinusoidal, which can be used to determine full core characterization. The circuit can be used as a magnetic core test bed to explore variable waveform excitation such as high frequency trapezoidal excitation. In some aspects, the circuit can be used to generate a voltage waveform with a trapezoidal excitation used to characterize a magnetic core with one primary coil of wire providing the excitation flux. The effect on the core can be measured with a secondary circuit that is connected to measurement devices. Using a secondary circuit for measuring the effect on the core can minimize an impact of the measurement devices on the sensed measurements.

Wide bandgap semiconductors have enabled an advent of increases in performance of many power converters. These power converters can leverage magnetic components as principal energy storage and transition elements. A complete understanding of the characteristics of these magnetic components can be useful for taking advantage of the increased semiconductor capabilities.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 is a block diagram of an electronic component measurement system 100 according to one example of the present disclosure. The system 100 includes a high voltage source 102, a low voltage source 104, H bridge circuits 106, 108, and an electronic component that is to be measured 110. The H bridge circuit 106 is conductively coupled to the high voltage source 102. The H bridge circuit 108 is conductively coupled to the low voltage source 104. The H bridge circuits 106, 108 include output ports 112, 114 for providing a voltage from a respective voltage source and with a predefined waveform to the electronic component to be measured 110. An example of the component to be measured 110 is a transformer, but other types of electronic components can alternatively be used.

The H bridge circuit 108 that is conductively coupled to the low voltage source 104 also includes one or more anti-series diodes 116 that can block signals from the high voltage source 102 from being provided to the low voltage source 104. The anti-series diode(s) 116 may be reverse diode(s) that can block the signals from the high voltage source to the low voltage source 104 and direct the signals from the voltage sources 102, 104 through the output ports 112, 114 to the electronic component to be measured 110.

In some examples, the high voltage source 102 is a power supply for providing a high slope of current to the electronic component to be measured 110. And, the low voltage source 104 is a power supply for providing a low slope of current to the electronic component to be measured 110. The output from the output ports 112, 114 can then be a flat top trapezoidal waveform or an HF sinusoid to the electronic component to be measured 110. The low voltage source 104 may include multiple power supplies that are each conductively coupled in parallel to the H bridge circuit 108. The shape of the predefined waveform delivered to the electronic component to be measured 110 can depend on the number of power supplies used for the low voltage source 104, the voltage levels of the power supplies for the low voltage source 104, or both.

In the example in which the electronic component is an HF transformer, to achieve a desired induction profile, high current can flow through the HF transformer with low to zero voltage. The H bridge circuit 108 can be a low voltage source converter connected to the transformer that can be used to achieve the desired induction profile. The ramp of the induction profile can be generated by a non-zero applied voltage. This means that the HF transformer can use both the high voltage source 102 and the H bridge circuit 108 as a low voltage source converter, to generate the desired induction profile.

Figure 2:
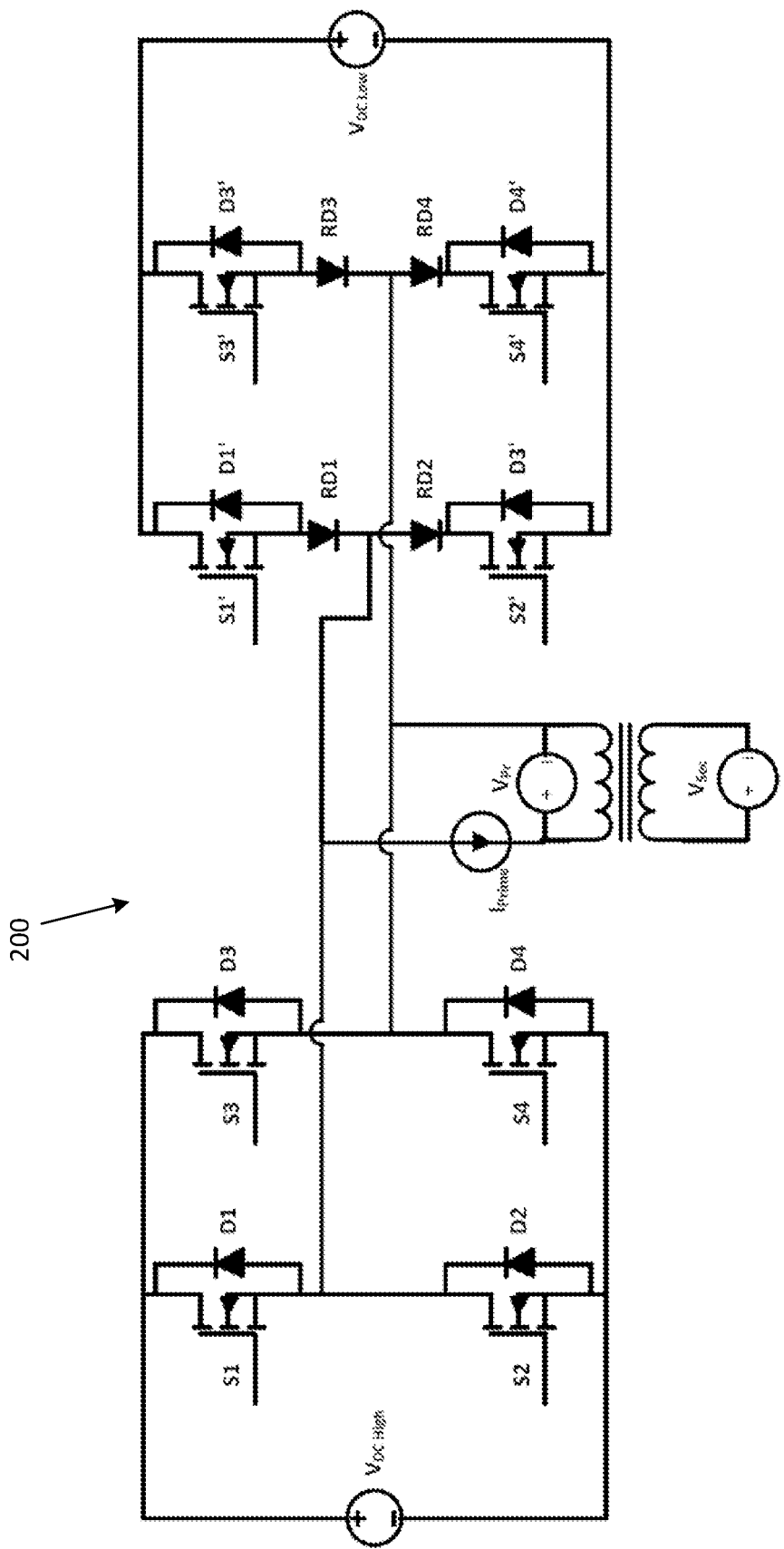
FIG. 2 is a schematic of an electronic component measurement system according to one example of the present disclosure.

FIG. 2 is a schematic of an electronic component measurement system 200 according to one example of the present disclosure. Voltage source $V_{DC\ High}$ represents a high voltage source. Voltage source $V_{DC\ Low}$ represents a low voltage source as compared to the high voltage source. The H bridge circuit for the high voltage source is represented by four MOSFET transistors S1, S2, S3, and S4, along with four diodes D1, D2, D3, and D4 that are forward-biased diodes. The electronic component to be measured is a transformer in this example. In other examples, the electronic component may be or include dielectric materials. The H bridge circuit for the low voltage source is represented by four MOSFET transistors S1', S2', S3', and S4', along with forward-based diodes D1', D2', D3', and D4' and anti-series (or reversed-biased) diodes RD1, RD2, RD3, and RD4.

Two MOSFET transistors S1', S3' are coupled to a positive side of the low voltage source. The other two MOSFET transistors S2', S4' are coupled to a negative side of the low voltage source. Each reverse-biased diode RD1, RD2, RD3, RD4 is coupled to a respective MOSFET transistor at an opposite side to which the respective MOSFET transistor is coupled to the low voltage source. In an alternative example, the reverse-biased diodes RD1, RD2, RD3, RD4 can be moved onto the DC rail. The H bridge circuit for the high voltage source does not include any reverse-biased diodes.

To apply two levels of excitation, two drive circuits that are voltage sources can be connected in parallel. The two H bridge circuits can be used to introduce the desired excitation waveform where the low voltage H bridge circuit can include anti-series diodes. The test circuit can leverage the advantages of open secondary tests. In this way, one coil can be used to excite the magnetic material of the transformer and the second coil can be used to measure the induced voltage on the transformer. The core characteristics and performance of the magnetic core can be studied by measuring the injected primary current and induced secondary voltage and using equations (2-4) below.

$$B(t) = \frac{1}{N_s A_c} \int_0^\tau v(\tau) d\tau \quad (2)$$

$$H(t) = \frac{N_p i(t)}{1_m} \quad (3)$$

$$\frac{P}{V_c} = f \oint H dB \quad (4)$$

This can allow the use of equations (2-4) when analyzing magnetic core materials. The left H bridge circuit can apply high voltage and can provide the high di/dt ramp of the desired exciting waveform. The right H bridge circuit can apply a lower voltage and can range from flat top, zero di/dt, to very close to the initial high di/dt. Careful gating can enable continuous current conduction without the use of any freewheeling diodes.

The transformer primary is connected to both H bridge converter circuits and the secondary can be left as an open circuit. This can allow direct analysis of induction (B by equation 5), magnetizing force (H by equation 6), and core loss by core volume (P over Vc by equation 7).

$$B(t) = \frac{1}{N_s A_c} \int_0^\tau v(\tau) \bigg| d\tau \quad (5)$$

$$H(t) = \frac{N_p i(t)}{1_m} \quad (6)$$

$$\frac{P}{V_c} = f \oint H dB \quad (7)$$

The core loss can be measured without the impact of any power flow through the transformer. All power loss measured can be transformer core loss or primary winding copper loss. $N_S$ and $N_P$ are the secondary and primary number of turns. $A_C$ is the effective cross sectional area and $I_m$ is the effective magnetic path. With the dual H bridge circuits, a gating scheme can be used to achieve the desired induction profile. An arbitrary trapezoidal induction profile can be generated by understanding that the high voltage source converter provides relatively high ramp to the induction profile shape and the low voltage source converter provides relatively low ramp to the profile. It can be determined from the time derivative of (5) that the two induction ramps are governed by the applied voltage to the transformer. For an example, the first half of a flat top trapezoid can be generated first by applying a positive voltage and then a zero voltage. Therefore, the voltage source converter can be gated for a duration to achieve the desired peak induction as seen in equation (8).

$$\Delta T = B_0 + \frac{\Delta B N_s A_c}{V_{Tx}} \quad (8)$$

This equation can be used for determining the "on" time at any point in the excitation. $B_0$ is the induction level at the start of the time period. $N_s$ is the number of turns and $A_C$ is the core cross sectional area. $V_{Tx}$ is the applied voltage level.

Figure 3:
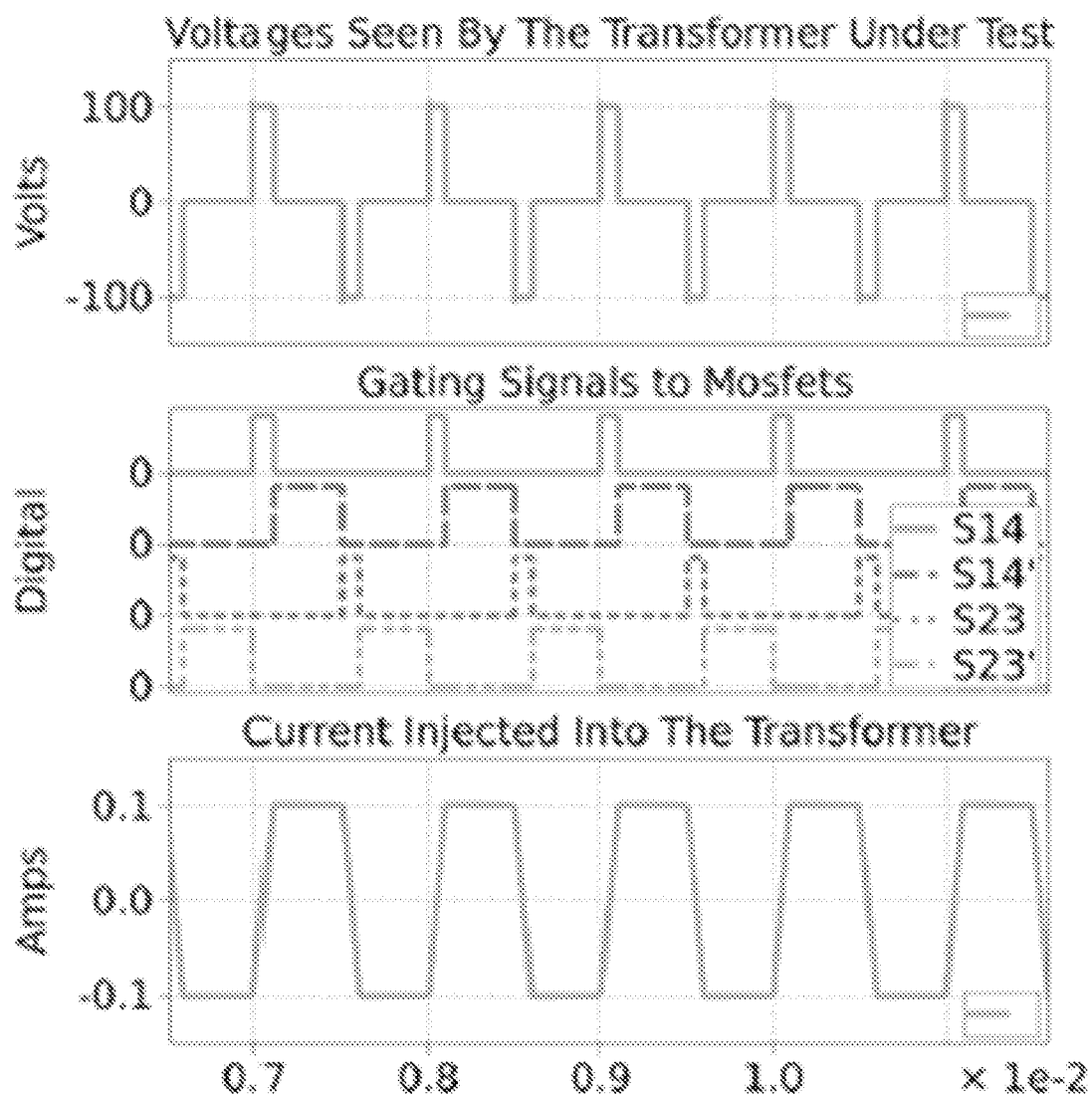
FIG. 3 depicts test waveforms with a low voltage matching the parasitic drop according to one example of the present disclosure.

Then the low voltage source converter is gated to an on state to provide a zero or low voltage current path. FIG. 3 depicts test waveforms with Vlow matching the parasitic drop according to one example. The applied voltage and corresponding gating signals is shown at the top and middle in FIG. 3, respectively. The bottom of FIG. 3 shows the resulting current excitation. The H bridge converter for the low voltage can be studied using PLECS™ magnetics software from Plexim GmbH, with switching components that include parasitic elements extracted from the datasheets. FIG. 3 can illustrate that a near ideal flat trapezoidal induction achievable. In this simulation, the results were achieved by matching the low voltage source voltage, VLow, to the parasitic voltage drop.

The same profile in FIG. 3 can be achieved with a DAB where the transformer turns ratio does not match the voltage ratio. This was achieved with a low voltage level higher than the parasitic drop. This can show the flexibility of the converter to provide desired induction profiles FIG. 4 depicts a table (Table I) with a description of the switch gating times as well as the voltage and current stress seen by each device according to one example of the present disclosure. To achieve the desired excitation shape, examples of the time that the device is "on" and the delay after which it is energized is listed in Table I. Based on the simulation, the voltage and current stresses are also shown below in Table I.

To further clarify and explain the operation of the system, FIGS. 5-9 replicate the schematic from FIG. 2, but show the switching progression for a positive half cycle to the negative half cycle. In FIGS. 5-9, the dark path is used to highlight the operating components. Although not limited to the order represented in FIGS. 5-9, the order of FIGS. 5-9 can represent one ordered process for operating the system. That is, when the MOSFETs are gated "on," the wires are conducting, and the diodes are forward biased and conducting in each FIG. The light components in each FIG. are not conducting.

Figure 5:
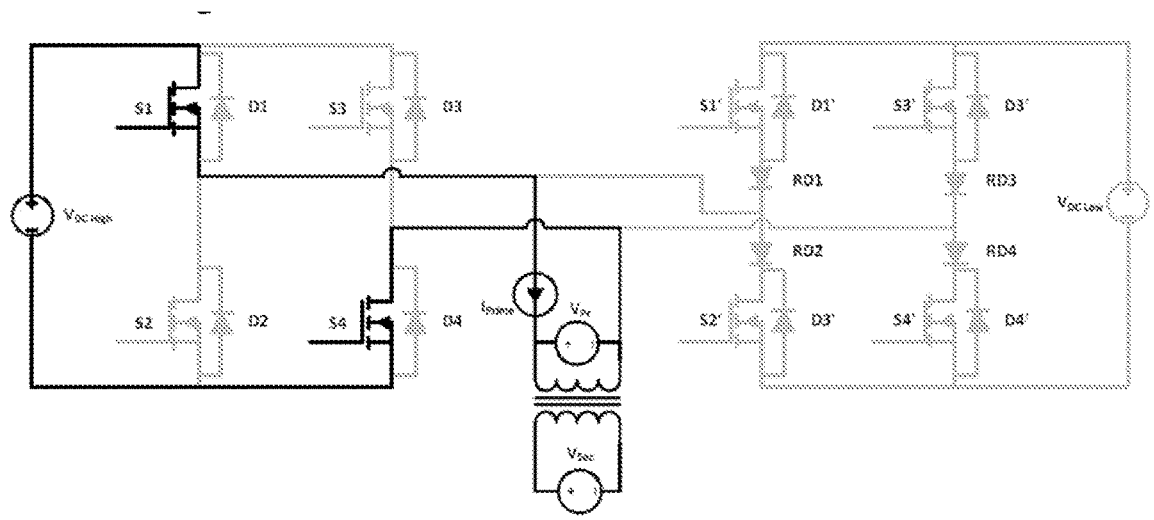
FIGS. 5-9 depict the schematic of FIG. 2 with different portions highlighted to show the portions conducting current in different stages according to some examples of the present disclosure.

FIG. 5 depicts positive high voltage applied to the core under test through MOSFETs S1 and S4 of the H bridge circuit for the high voltage source according to one example of the present disclosure.

Figure 6:
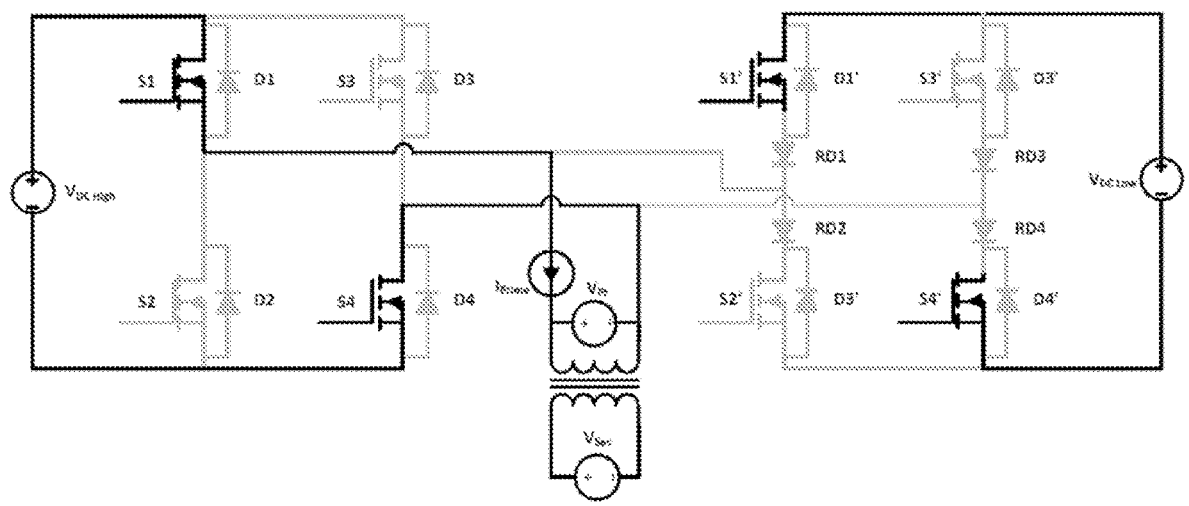

FIG. 6 depicts MOSFET transistors S1' and S4' of the H bridge circuit for the low voltage source being pre-gated to an on state.

Figure 7:
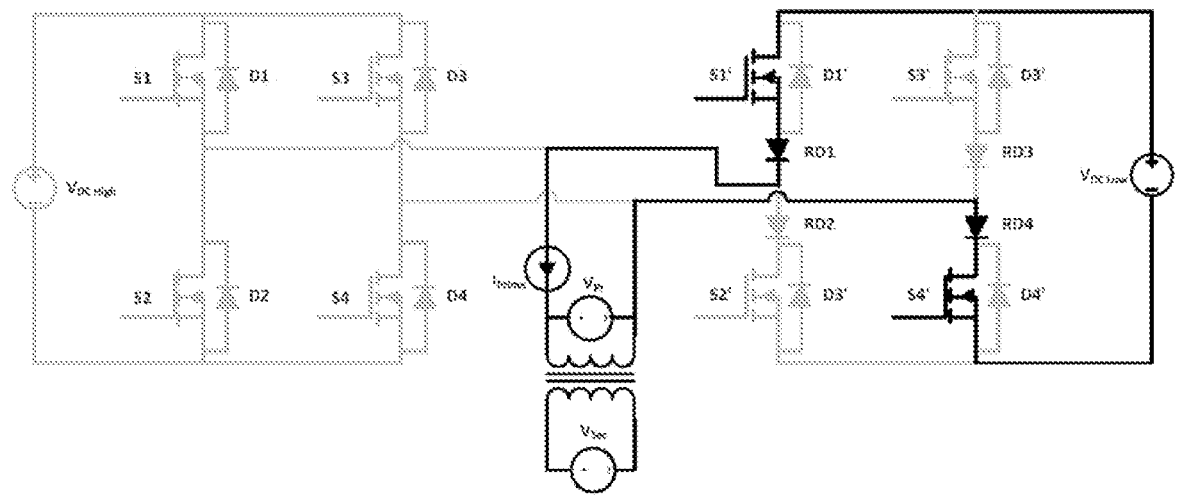

In some aspects, the switching procedure in this dual topology can prematurely gate to an on state the MOSFETs in the H bridge circuit for the low voltage source. This pre-gating can enable the transition of conducting exciting current from the high voltage H bridge converter circuit to the low voltage H bridge converter circuit with the turn-on delay of the anti-series (reverse) diodes. While the high voltage H bridge converter circuit is "on," the diodes can be reverse biased and blocking any shoot-through current between the two H bridge converter circuits. Once the high voltage converter is gated "off," the reverse diodes can become forward biased and conduct. FIG. 7 depicts conduction through reverse diodes and MOSFETs S1' and S4' of the H bridge circuit for the low voltage source to achieve low voltage excitation.

Figure 8:
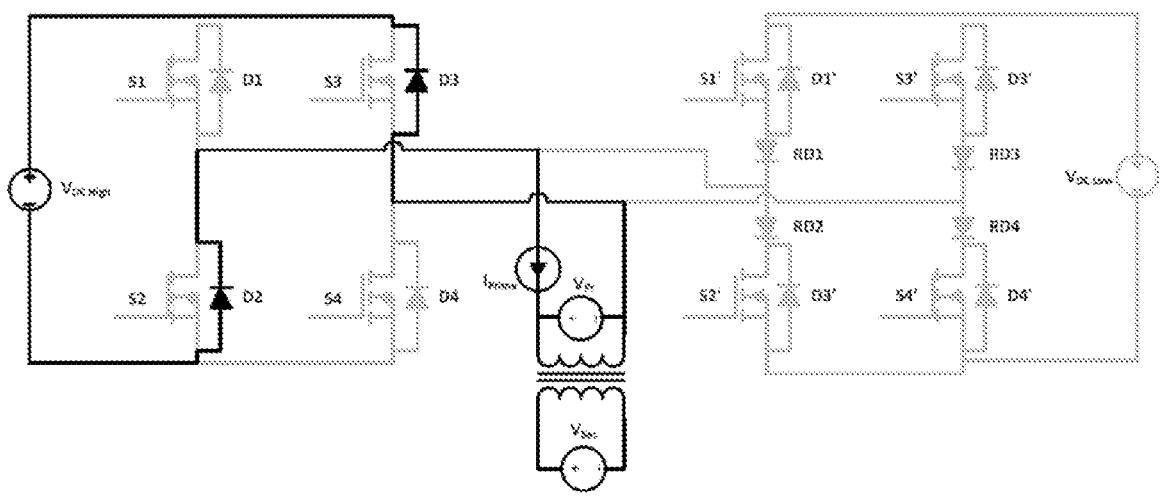

Once the desired induction level is achieved through the second ramp of current, negative excitation can be used. It can be acceptable if there is an applied negative voltage resulting from conduction through the freewheeling diodes, as shown in FIG. 8.

But, this negative voltage can be greater than the desired negative voltage calculated by equation (9) and should be minimized by gating on the proper MOSFETs.

$$V_{TX} = -(V_{DC} + 2V_{on}) + i(t)R_{cu} \quad (9)$$

In equation (9), $V_{TX}$ is the transformer voltage, $V_{DC}$ is the applied DC voltage, $V_{on}$ is the forward voltage drop of free-wheeling diodes, i(t) is time varying current, and $R_{cu}$ is conduction path resistance.

Figure 9:
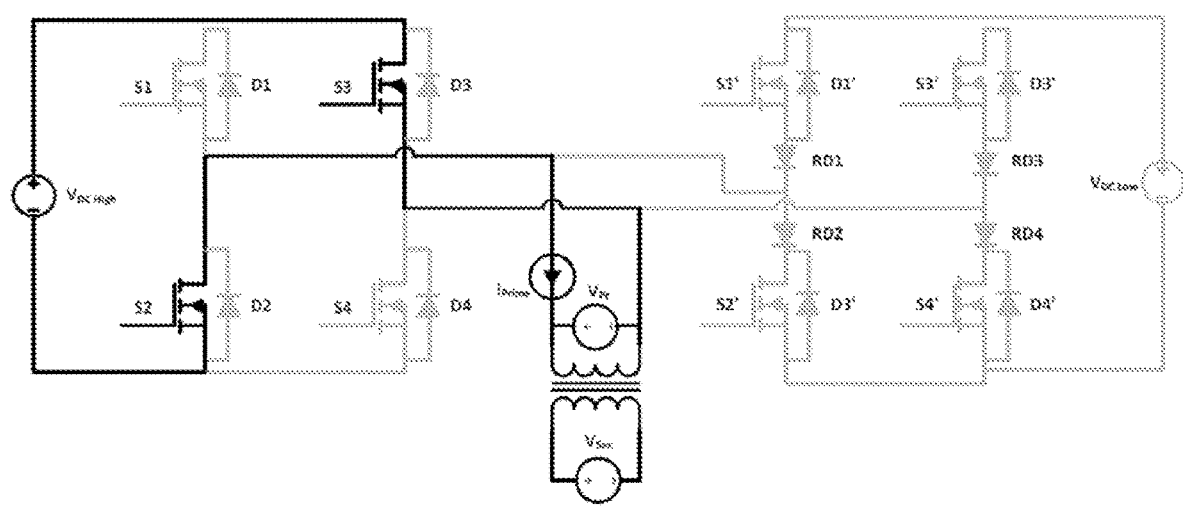

FIG. 9 depicts negative high voltage applied to the core under test through MOSFETs S2 and S3 of the H bridge circuit for the high voltage source.

FIGS. 5-9 illustrate that desired excitation current can be applied to a magnetic core of a transformer under test. This converter can apply two separate voltage levels while continuing to supply positive current within the positive half cycle of a predefined waveform.

Trapezoidal Excitation Experimental Results

To validate a system according to some examples, a 1200V/2 kVA prototype test bed can be developed based on the circuit in FIG. 2. In this implementation, the two H bridge circuits can be controlled by four pulse-width modulation (PWM) channels. Diagonal MOSFETs can be gated with the same PWM signal. The circuit can be connected with separate DC supplies and two cores can be tested to verify the test circuit performance and capabilities. In some examples, the applied induction level can be determined and used to relate the results to other loss maps. For example the following equations can be used to determine the sinusoidal (AC) induction level $B_{AC}$ (10), the induction levels for both bipolar square $B_{SQ}$ (11) and two level square $B_{SQ2}$ (12).

$$B_{AC} = \frac{\sqrt{2}}{2\pi ANf} V_{rms} \quad (10)$$

$$B_{SQ} = \frac{1}{4ANf} V_{DC} \quad (11)$$

$$B_{SQ2} = \frac{1}{4ANf} DV_{High} + \left(\frac{1}{2} - D\right) V_{Low} \quad (12)$$

In these equations, A is the cross-section area of the coil, N is the number of turns, f is the frequency of the current in Hertz, $V_{rms}$ is voltage of the root mean square, $V_{DC}$ is the DC voltage, D is diameter, $V_{High}$ is the high voltage, and $V_{Low}$ is the low voltage.

In some examples, two different cores can be tested with trapezoidal excitation. First, an AMCC amorphous Metglass core and then an HTX nanocrystaline core. The primary current used to excite the current can be measured with a Tektronix TCP202A. This can enable a loss accuracy better than 6%.

Figure 10:
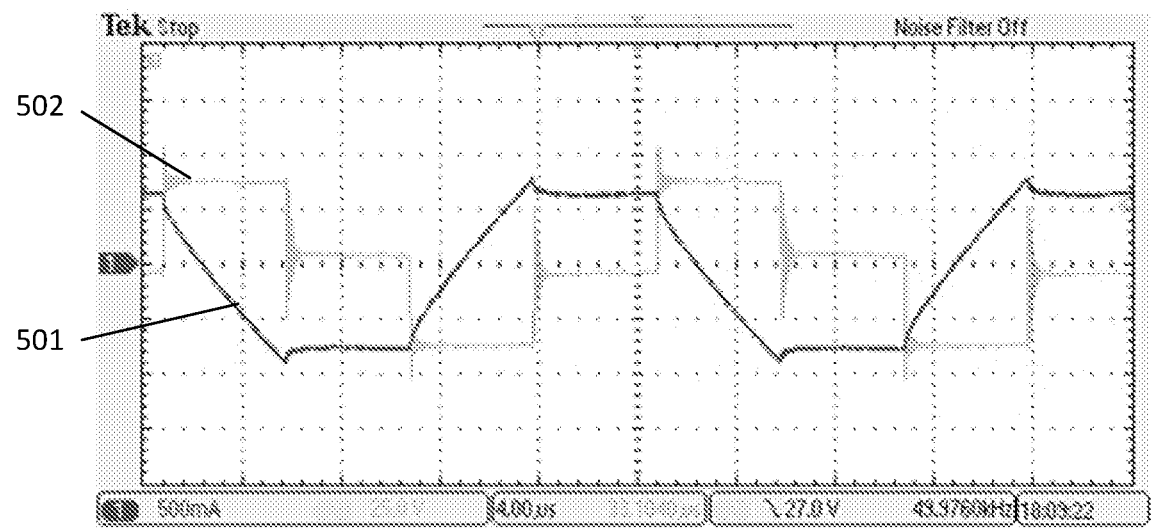
FIG. 10 is a chart of current excitation and induced voltage from a test of a circuit on an AMCC core according to one example of the present disclosure.
Figure 11:
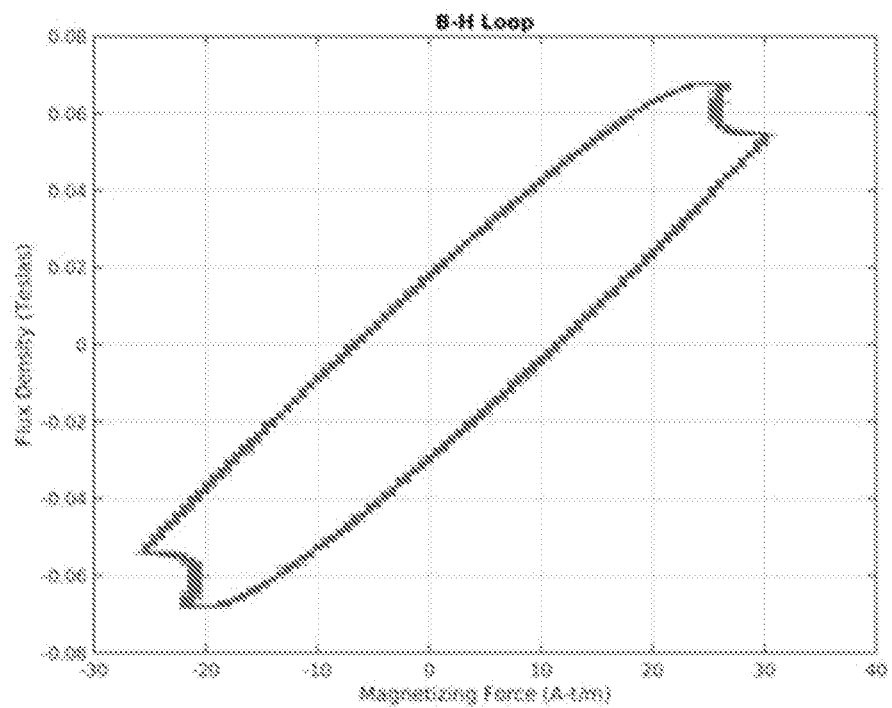
FIG. 11 depicts a hysteresis loop resulting from the test reflected in FIG. 10 according to one example of the present disclosure.
Figure 12:
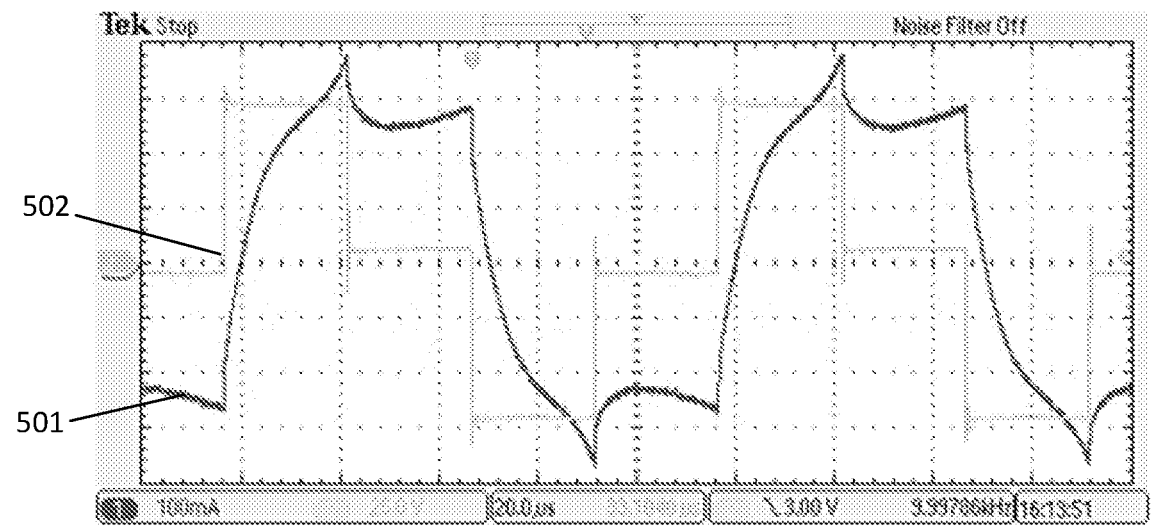
FIG. 12 is a chart of current excitation and induced voltage from a test of a circuit on an HTX core according to one example of the present disclosure.
Figure 13:
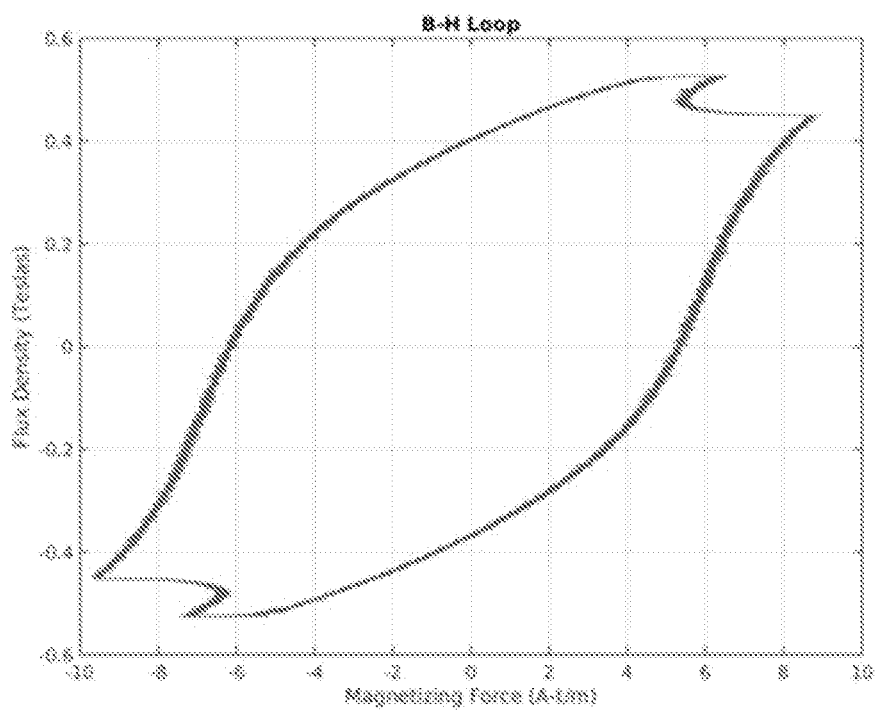
FIG. 13 depicts a hysteresis loop resulting from the test reflected in FIG. 12 according to one example of the present disclosure.
Figure 14:
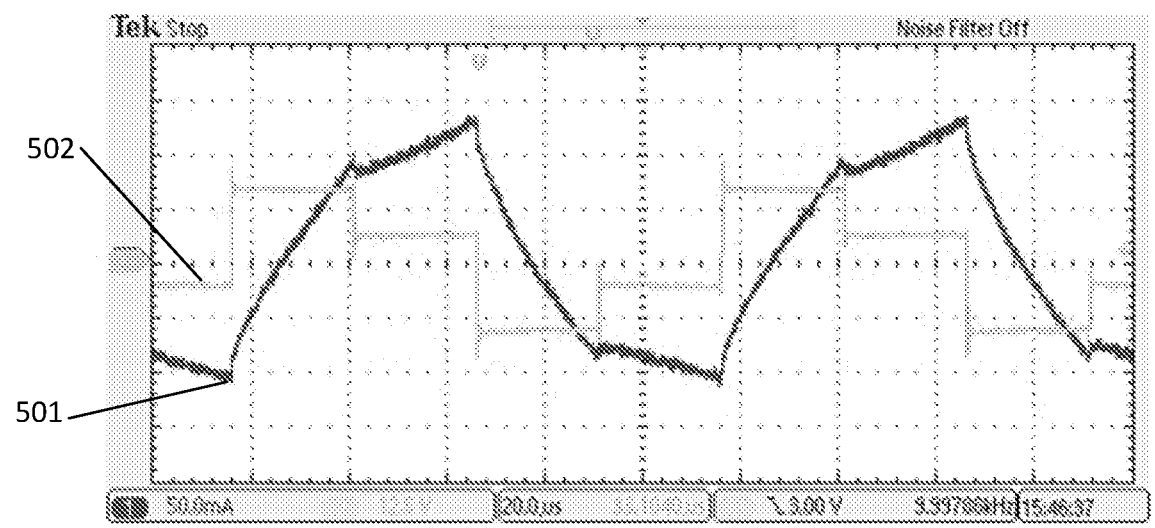
FIG. 14 is a chart of current excitation and induced voltage from another test of a circuit on an HTX core according to one example of the present disclosure.
Figure 15:
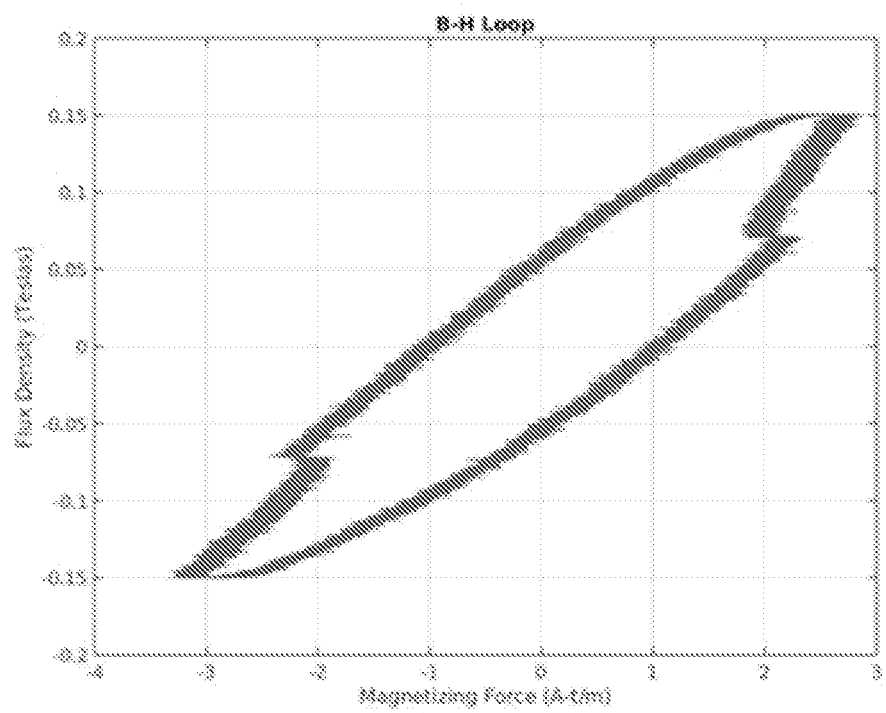
FIG. 15 depicts a hysteresis loop resulting from the test reflected in FIG. 14 according to one example of the present disclosure.

FIGS. 10, 12, and 14 show an example of the current excitation and induced voltage from the test circuit. Examples of hysteresis curves are shown in FIGS. 11, 13, and 15 and can be developed by post processing the measured values. In FIGS. 10, 12, and 14, Channel 1 (501) can be the primary current energizing the exciting current and Channel 2 (502) can be the applied voltage. From these results it can be determined that trapezoidal excitation is achieved. FIGS. 10-11 show the results for a representative amorphous material, AMCC. FIGS. 12-13 show the results for a repetitive nanocrystaline material, HTX.

An item can occur during the transition from a high voltage to low voltage level of the same polarity. Despite no significant sign change in the applied voltage, there can still be a negative di/dt. To verify that this is not an artifact of the converter and switching ripple, the low voltage level can be increased to maintain no voltage sign change even with switching ripple. The negative di/dt can still be present and can be a material property. These results are shown in FIGS. 14-15 with the HTX core. This behavior can further highlight the use for this testing circuit to accurately characterize magnetic materials with trapezoidal excitation.

A sample of the AMCC core tests is shown in FIG. 10. In particular, the low voltage side can be tuned to provide a flat top trapezoidal excitation. Parasitic capacitance between the exciting turns, the sensing turns, and with the core introduces some secondary voltage ringing during the voltage transitions. But, this ringing may not be present in the applied primary voltage. FIG. 11 shows the hysteresis loop that can result from this excitation.

A sample of the HTX core tests is shown in FIG. 12. In these results, a large excitation difference between the two positive levels is shown. Furthermore, in these results the capability of providing two separate slopes of exciting current is shown. Again, some parasitic capacitances introduce voltage ringing on the measured secondary voltage. But, this ringing may not be present on the applied primary voltage. FIG. 13 shows the hysteresis loop that can result from the excitation and induction of FIG. 12. The current slip evident in the first set of results can be more pronounced in these with the higher transition range of applied voltage. This slip exists despite no application of negative voltage that may satisfy the negative di/dt.

An undesirable switching ripple between voltage transitions can occur. In some examples, the gating resistance can be increased to slow the dv/dt and reduce the ripple. Reducing the switching ripple can provide results that more accurately reflect the material properties without noise introduced by the test hardware.

Figure 16:
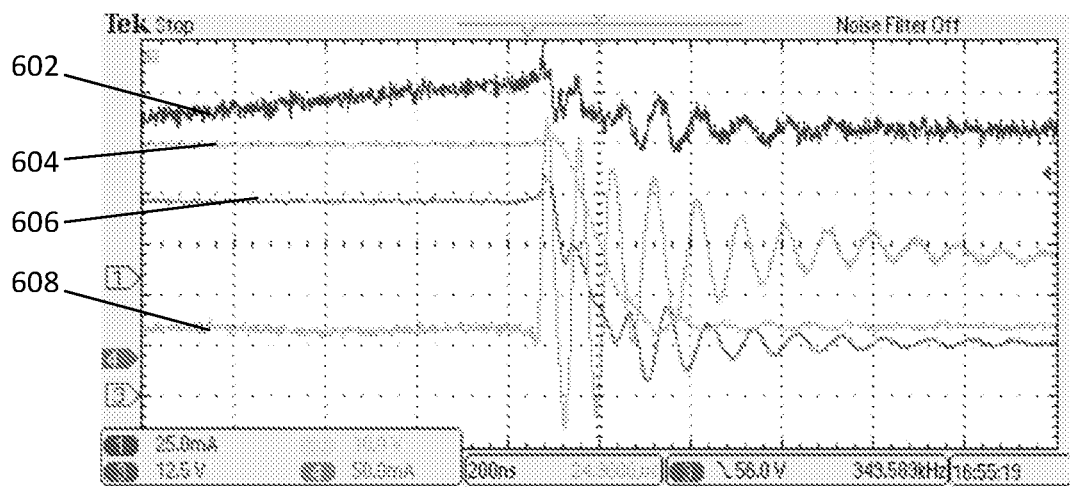
FIG. 16 depicts a chart of current contribution from two voltage sources using different channels according to one example of the present disclosure.
Figure 17:
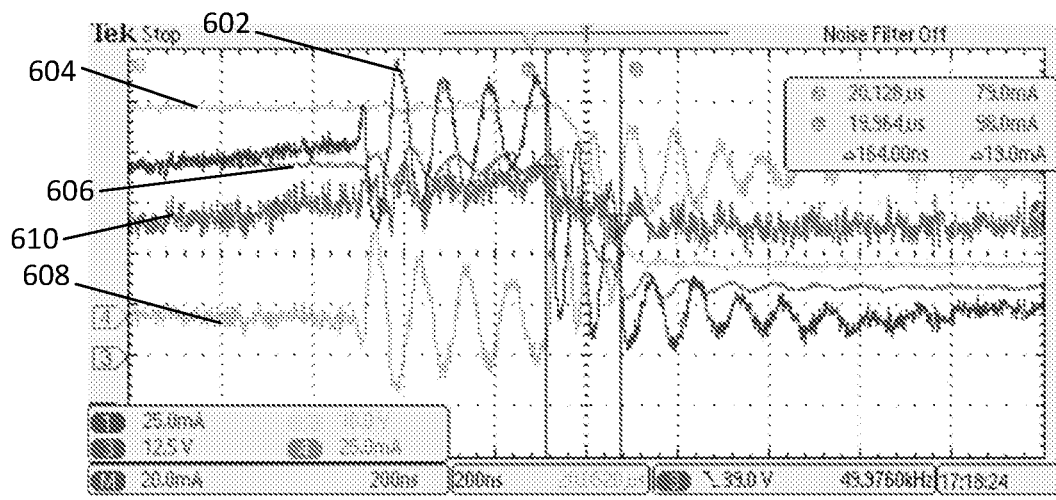
FIG. 17 depicts a chart of current contribution from two voltage sources using different channels, along with a deadband, according to one example of the present disclosure.
Figure 18:
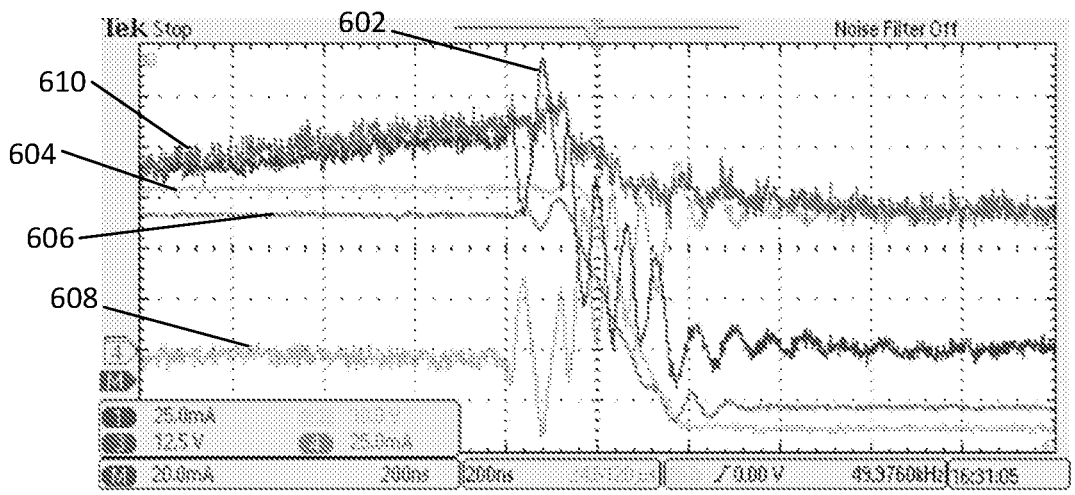
FIG. 18 depicts a chart of current contribution from two voltage sources using different channels to reduce ripple according to one example of the present disclosure.

In both presented waveforms and in other recorded data, there can be a negative di/dt during the high positive to low positive transition. This negative slope can exist despite never applying negative voltage to the core under test. To verify that this is not a circuit artifact, the current contribution of the two separate converters can be analyzed separately and added together to determine the total current injection. FIGS. 16-18 show measured results.

In FIGS. 16-18, channel 1 (602) can be the high side current, channel 2 (604) can be the primary voltage, channel 3 (606) can be the secondary voltage, channel 4 (608) can be the low side current, and line 610 can be the current into exciting coil.

First, the MOSFET gating on time of the low voltage converter can be adjusted to study the impact of the switches transition. In FIG. 16, the low voltage MOSFETs can be gated to an on state immediately after the high voltage MOSFETs are gated to an off state with no deadband. The current contribution of the low voltage converter, channel 4 (608) can be observed to indicate that this turn on time results in a significant resonant ringing of several MHz. This can result from the discharge of switch capacitances and the parasitic inductance of traces and conductors. With this much switching noise, the current injected into the core under test, channel 1 (602) can inherit some of this ringing that in turn can show on the measured secondary voltage, channel 3 (606). The applied voltage, channel 2 (604) can include some small ringing as well. In some examples, the voltage can always be positive and yet the current measured into the transformer can have a negative di/dt period during the transition.

As mentioned in the previous section, it can be beneficial to pre-gate the low voltage side MOSFETs. An example of this negative deadband is shown below in FIG. 17. The current contribution from both converters can be measured and summed to determine the exciting current. A reduction in switching ripple can be achieved now that only the capacitance of the anti-series diodes can be discharged.

Again, the exciting current can show a negative di/dt. The magnetizing inductance can be calculated during the steady state positive voltage with positive di/dt period. Using this inductance and the negative di/dt measured in FIG. 17, a negative voltage of 3.5 kV can be expected.

To further reduce the switching noise, the MOSFET switch speed can be slowed down. This can be achieved by increasing the gate resistance from 10Ω to 25Ω. FIG. 18 shows an example of that approach can provide reduced ripple.

In the construction of the prototype, emphasis can be placed on constructing the circuit from a modified platform. The design may not be optimized for minimal parasitic inductances. Future iterations can bring this approach into the design to further reduce switching ripple. But, the presented FIGS. indicate that the switching ripple can primarily oscillates between the two converters. The impedance path of the core under test can be much higher than the other converter. This switching ripple, while present, can have little impact on the resulting magnetic core characterization.

In some aspects, the dual voltage source converter for applying trapezoidal induction waveforms to magnetic devices can be used to better analyze and study magnetic core losses. The wave shapes generated by the dual voltage source converter can be applied to a variety of systems including the magnetics in the dual active bridge circuit, but other implementations are possible. In some examples, the dual voltage source converter can enable open secondary testing, eliminate external parasitic influences, and simplify analysis. Furthermore, the dual voltage source converter can increase flexibility in shaping the excitation waveform.

The circuit can be modeled and verified in PLECS™ software simulations. A laboratory scale prototype can be constructed and verified to the simulations. In some examples, magnetic cores can be used that include amorphous, nanocrystaline, ferrite, or high silicon steel. In additional or alternative examples, any core material can be used including air. The circuit can provide a unique solution for further understanding magnetic core losses. The circuit, and the results and analysis enabled by it, can provide a significant step in the study of magnetic materials and magnetic optimization for power electronics such as the dual active bridge. In some examples, analysis can indicate a drop in the excitation current during changes in the applied voltage level. This drop can exist despite the applied voltage not crossing zero and going negative. This circuit can be used to show that this drop can be seen and verified in high to low transitions, of the same polarity. With a converter according to various examples, the ability to study deeper magnetization processes may be possible. This converter may allow the study and creation of the specific excitation waveforms expected in a practical converter.

Figure 19:
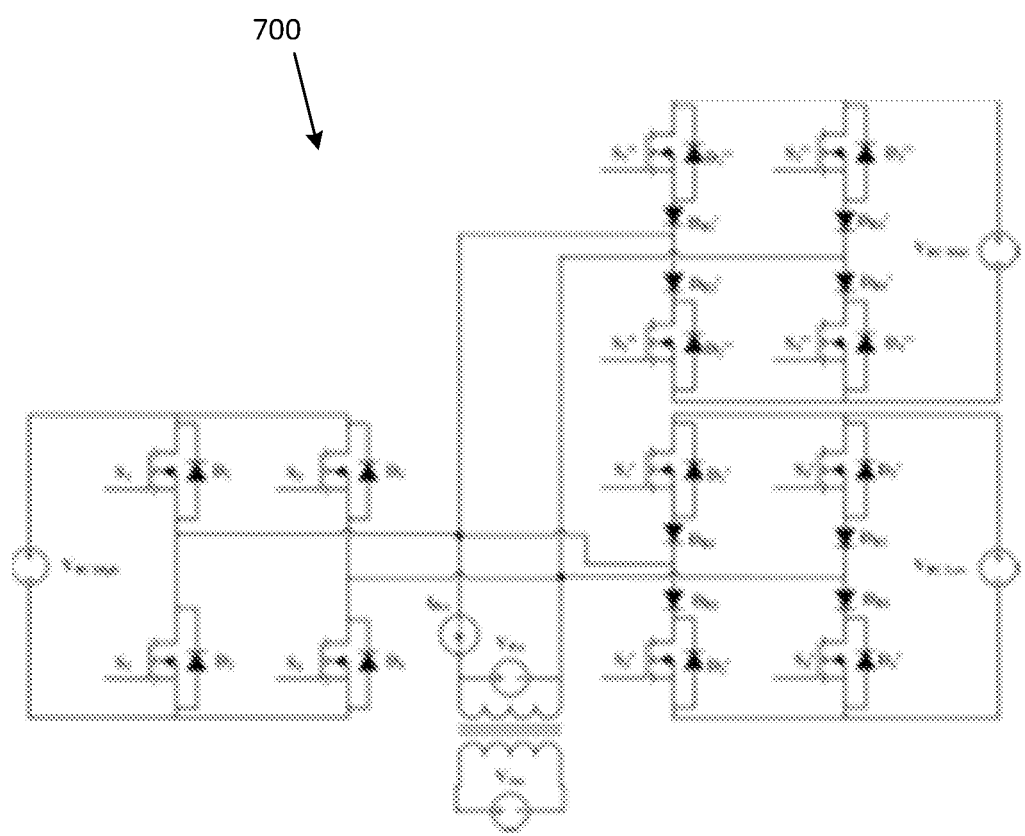
FIG. 19 is a schematic of an electronic component measurement system according to another example of the present disclosure.

FIG. 19 is a schematic of an electronic component measurement system 700 according to another example of the present disclosure. The system 700 includes multiple low voltage sources and multiple H bridge circuits corresponding to the low voltage sources. The H bridge circuits corresponding to the low voltage sources each include anti-series diodes. The voltage can be split among the low voltage sources and the high voltage source and is able to generate a six level sinusoid-like voltage wave. In this case, the total harmonic distortion of the excitation current can be less than 3%. In this configuration, the N H bridge circuits (also referred to as converters) can generate a 2N level sinusoidal wave. The control gating can be based on comparison with a sine wave. The circuit may eliminate deadband in the gating signals. Since a different converter conducts the next level voltage and is protected with an anti-series diode, protection to delay the turn to on-state of the power MOSFET transistors may not be necessary. This can enable higher switching frequencies and smoother excitation at high power. This approach can be used for more complex and arbitrary excitations such as quasi-resonant ones. A shape of the predefined waveform can be based on a number of power supplies used or the voltage levels of the power supplies used.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure. The examples of claims presented below are also not intended to be exhaustive or to limit claims emanating from the disclosure.

What is claimed is:

1. A circuit comprising:
    a first power supply;
    a second power supply;
    a first H bridge circuit conductively coupled in parallel to the first power supply; and
    a second H bridge circuit conductively coupled in parallel to the second power supply, the second H bridge circuit including one or more anti-series diodes for preventing current from the first power supply from passing through the second H bridge circuit to the second power supply,
    wherein the first H bridge circuit and the second H bridge circuit are configured to conductively couple to an electronic component for providing a voltage with a predefined waveform to the electronic component.

2. The circuit of claim 1, wherein the first power supply is configured to provide a higher voltage than the second power supply, the second power supply being configured for providing a low slope of current to the electronic component, wherein the predefined waveform is a flat top trapezoidal waveform or a high frequency sinusoid waveform.

3. The circuit of claim 1, wherein the second power supply comprises a plurality of power supplies, each power supply of the plurality of power supplies being conductively coupled in parallel to an H bridge circuit that includes one or more anti-series diodes, wherein a shape of the predefined waveform is based on a number of power supplies among the plurality of power supplies or voltage levels of the power supplies among the plurality of power supplies.

4. The circuit of claim 1, wherein the second H bridge circuit comprises:
    a plurality of MOSFET transistors;
    a plurality of forward-biased diodes, each forward-biased diode of the plurality of forward-biased diodes corresponding to one MOSFET transistor of the plurality of MOSFET transistors,
    wherein the one or more anti-series diodes include a plurality of reverse-biased diodes, each reverse-biased diode of the plurality of reverse-biased diodes corresponding to one MOSFET transistor of the plurality of MOSFET transistors.

5. The circuit of claim 4, wherein the plurality of MOSFET transistors is four MOSFET transistors, wherein the plurality of forward-biased diodes is four forward-biased diodes, wherein the plurality of reverse-biased diodes is four reverse-biased diodes.

6. The circuit of claim 5, wherein two MOSFET transistors are coupled to a positive side of the second power supply, wherein the other two MOSFET transistors are coupled to a negative side of the second power supply, wherein each reverse-biased diode is coupled to a respective MOSFET transistor at an opposite side to which the respective MOSFET transistor is coupled to the second power supply.

7. The circuit of claim 4, wherein the first H bridge circuit comprises:
    a plurality of first MOSFET transistors; and
    a plurality of first forward-biased diodes,
    wherein the first H bridge circuit does not include any anti-series diodes.

8. The circuit of claim 7, wherein at least two first MOSFET transistors of the plurality of first MOSFET transistors are configured to be gated on to provide voltage from the first power supply to the electronic component, wherein, while the voltage from the first power supply is provided to the electronic component, at least two MOSFET transistors of the plurality of MOSFET transistors are configured to be pre-gated on and at least two reverse-biased diodes of the plurality of the reverse-biased diodes are configured to prevent current from the first power supply from passing through the second H bridge circuit, wherein the at least two reverse-biased diodes of the plurality of the reverse-biased diodes are configured to respond to the at least two first MOSFET transistors being gated off by conducting current and allowing voltage from the second power supply to be provided to the electronic component.

9. The circuit of claim 1, wherein the electronic component is a transformer, wherein the circuit is configured to apply two separate voltage levels from the first power supply and the second power supply while continuing to supply positive current to the transformer within a positive half cycle of the predefined waveform.

10. The circuit of claim 1, wherein the first H bridge circuit and the second H bridge circuit are configured to be controlled using a plurality of pulse-width modulation channels.

11. A method comprising:
    gating a first H bridge circuit to an on state to provide voltage from a first voltage source to an electronic component;
    while voltage is being provided from the first voltage source to the electronic component, pre-gating a second H bridge circuit to the on state and preventing, by one or more anti-series diodes of the second H bridge circuit, the voltage from the first voltage source from passing through the second H bridge circuit;
    gating the first H bridge circuit to an off state to stop providing voltage from the first voltage source to the electronic component; and
    in response to the first H bridge circuit gating to the off state, allowing voltage from a second voltage source associated with the second H bridge circuit to be provided to the electronic component,
    wherein the voltage from the first voltage source and the second voltage source is provided to the electronic component in a predefined waveform.

12. The method of claim 11, wherein the first voltage source provides voltage at a higher level than the second voltage source.

13. The method of claim 11, wherein the second H bridge circuit comprises:
- a plurality of MOSFET transistors;
- a plurality of forward-biased diodes, each forward-biased diode of the plurality of forward-biased diodes corresponding to one MOSFET transistor of the plurality of MOSFET transistors,
- wherein the one or more anti-series diodes include a plurality of reverse-biased diodes, each reverse-biased diode of the plurality of reverse-biased diodes corresponding to one MOSFET transistor of the plurality of MOSFET transistors.

14. The method of claim 11, wherein the predefined waveform is a flat top trapezoidal waveform or a high frequency sinusoid waveform.

15. An H bridge circuit comprising:
- a plurality of MOSFET transistors configured to conductively couple to a voltage source;
- a plurality of forward-biased diodes, each forward-biased diode of the plurality of forward-biased diodes corresponding to one MOSFET transistor of the plurality of MOSFET transistors; and
- one or more anti-series diodes configured to prevent current from a second voltage source from passing through the H bridge circuit in providing voltage to an electronic component to be measured using a predefined waveform formed from voltage from the voltage source and the second voltage source.

16. The H bridge circuit of claim 15, wherein the plurality of MOSFET transistors is four MOSFET transistors, wherein the plurality of forward-biased diodes is four forward-biased diodes, wherein the one or more anti-series diodes are four reverse-biased diodes.

17. The H bridge circuit of claim 16, wherein two MOSFET transistors are coupled to a positive side of the voltage source, wherein the other two MOSFET transistors are coupled to a negative side of the voltage source, wherein each reverse-biased diode is coupled to a respective MOSFET transistor at an opposite side to which the respective MOSFET transistor is coupled to the voltage source.

18. The H bridge circuit of claim 15, wherein at least some MOSFET transistors of the plurality of MOSFET transistors are configured to be pre-gated to an on state and the one or more anti-series diodes are configured to prevent voltage from the second voltage source from passing through the H bridge circuit, while voltage is being provided from the second voltage source to the electronic component.

19. The H bridge circuit of claim 15, wherein the predefined waveform is a flat top trapezoidal waveform or a high frequency sinusoid waveform.

20. The H bridge circuit of claim 15, wherein the H bridge circuit is configured to couple in parallel to the voltage source.

* * * * *